United States Patent
Knoll et al.

(10) Patent No.: US 9,640,702 B2
(45) Date of Patent: May 2, 2017

(54) HIGH-SPEED GERMANIUM PIN PHOTODIODE

(71) Applicant: IHP GmbH-Innovations for High Performance Microelectronics/Leibniz-Institut fur Innovative Mikroelektronik, Frankfurt (Oder) (DE)

(72) Inventors: Dieter Knoll, Frankfurt (DE); Stefan Lischke, Frankfurt (DE)

(73) Assignee: IHP GMBH—INNOVATIONS FOR HIGH PERFORMANCE MICROELECTRONICS/LEIBNIZ— INSTITUT FUR INNOVATIVE MIKROELEKTRONIK, Frankfurt (DE)

( * ) Notice: Subject to any disclaimer, the term of this patent is extended or adjusted under 35 U.S.C. 154(b) by 0 days.

(21) Appl. No.: 15/134,784

(22) Filed: Apr. 21, 2016

(65) Prior Publication Data

US 2017/0025562 A1 Jan. 26, 2017

(30) Foreign Application Priority Data

Apr. 24, 2015 (DE) .......... 10 2015 207 618
Jun. 30, 2015 (DE) .......... 10 2015 212 208

(51) Int. Cl.
*H01L 31/02* (2006.01)
*H01L 31/105* (2006.01)
*G02B 6/42* (2006.01)
*H01L 31/0232* (2014.01)
*H01L 31/0288* (2006.01)

(52) U.S. Cl.
CPC .............. *H01L 31/105* (2013.01); *G02B 6/42* (2013.01); *H01L 31/02005* (2013.01); *H01L 31/0288* (2013.01); *H01L 31/02327* (2013.01)

(58) Field of Classification Search
CPC ......... H01L 31/02; H01L 31/02; H01L 31/02; H01L 31/02005; H01L 31/023; H01L 31/0232; H01L 31/02327; H01L 31/028; H01L 31/0288
USPC .......................................... 257/432
See application file for complete search history.

(56) References Cited

U.S. PATENT DOCUMENTS

| 6,778,723 | B1 | 8/2004 | Yang |
| 2013/0071058 | A1 | 3/2013 | Lim et al. |
| 2014/0024657 | A1 | 1/2014 | Yuan et al. |
| 2015/0016769 | A1 | 1/2015 | Verma et al. |

(Continued)

FOREIGN PATENT DOCUMENTS

DE   10 2013 201644 A1   3/2014

OTHER PUBLICATIONS

Yi Zhang, et al; "A high-responsivity photodetector absent metal-germanium direct contact"; OSA; vol. 22, No. 9; May 2, 2014; pp. 11367-11375.

(Continued)

*Primary Examiner* — Monica D Harrison
(74) *Attorney, Agent, or Firm* — Ware, Fressola, Maguire & Barber LLP

(57) ABSTRACT

A diode is described which comprises a light-sensitive germanium region (5) located on a waveguide (2) made of silicon or silicon germanium and which has lateral dimensions in a direction transverse to a direction of light propagation in the waveguide that are identical or at most 20 nm per side shorter in comparison with the waveguide.

15 Claims, 26 Drawing Sheets

(56) References Cited

U.S. PATENT DOCUMENTS

2015/0069565 A1    3/2015    Na

OTHER PUBLICATIONS

S. Sahni, et al; "The DUa-Heterjunction Ge on Si Photodetector"; Luxtera, Inc.; ECS Transactions; vol. C4, Issue 6; 2014; pp. 783-789.

Leopold Virot, et al; High-performance waveguide-integrated germanium PIN photodiodes for optical communication applications [Invited]; Photon. Res.; vol. 1, No. 3, Oct. 2013; pp. 140-147.

D. Knoll, et al; "High-Performance Photonic BiCMOS Process for the Fabrication of High-Bandwidth Electronic-Photonic Integrated Circuits"; 2015 IEEE International Electron Devices Meeting; Dec. 7, 2015; pp. 402-405.

HIGH-SPEED GERMANIUM PIN PHOTODIODE

CROSS REFERENCE TO RELATED APPLICATIONS

This application claims priority under 35 USC §119 to German Patent Application No. 102015207618.0 filed on Apr. 24, 2015 and German Patent Application No. 102015212208.5 filed on Jun. 30, 2015. Both applications are hereby incorporated by reference in their entirety.

TECHNICAL FIELD

The invention relates to a diode comprising a light-sensitive germanium region.

BACKGROUND OF THE INVENTION

Optical and optoelectronic components produced with a silicon-based technology are key components, for example for optical telecommunications or for optical connections within or between microelectronics circuits. Examples of such components are couplers, waveguides, modulators and photodetectors, in particular.

Modern photodetectors use germanium (Ge) as a detector material due to its significantly better absorbance compared to silicon in the wavelength range used for optical communication ($\lambda=1.3$-$1.6$ μm). A PIN diode, so called, is often used as a detector. "P" stands for a p-doped region, "I" for an intrinsic region and "N" for an n-doped semiconductor region. Important parameters of the diode are dark current, photocurrent, responsivity and optical bandwidth.

Very fast germanium photodiodes with an intrinsic region width of a few hundred nanometers and with an optical bandwidth of 50 GHz and more have already been demonstrated.

Such germanium photodiodes are typically produced by epitaxial growth of a germanium layer directly on an SOI (silicon on insulator) substrate, which allows direct coupling of the detector to the waveguide made from the upper monocrystalline silicon layer of the SOI structure. The light to be detected can thus be supplied parallel to the waveguide-diode interface, which allows the diode to be independently optimized, to a degree, with regard to responsivity and optical bandwidth.

The diodes are mostly contacted by the contact metal directly touching highly doped germanium regions which laterally or vertically adjoin the intrinsic germanium region. This results in losses because of light absorption by the metal electrodes and due to light absorption by free charge carriers in the doped germanium regions, thus limiting the responsivity of the diodes.

In order to prevent such losses, a photodiode that avoids having highly doped germanium regions, and in which the diode is contacted with metal via doped non-absorbing silicon regions which touch the absorbing intrinsic germanium region from below, was presented in the publication by Yi Zhang, Shuyu Yang, Yisu Yang, Michael Gould, Noam Ophir, Andy Eu-Jin Lim, Guo-Qiang Lo, Peter Magill, Keren Bergman, Tom Baehr-Jones, and Michael Hochberg entitled "A high-responsivity photodetector absent metal-germanium direct contact", May 5, 2014, Vol. 22, No. 9, DOI:10.1364/OE.22.011367, OPTICS EXPRESS 11367-11375, referred to hereinafter as [1]. One disadvantage of this prior art photodiode is that a high responsivity and a high bandwidth are not achieved until very high operating voltages greater than 4V are used.

This disadvantage was mitigated with a germanium PIN photodiode proposed in the publication by S. Sahni, N. K. Hon, and G. Masini entitled "The Dual-Heterojunction Ge on Si Photodetector", ECS Transactions, Vol. 64, issue 6, pp. 783-789, referred to hereinafter as [2], but with acceptance of a relatively narrow bandwidth less than 50 GHz.

In summary, no germanium PIN photodiodes are known from the prior art that achieve bandwidths significantly greater than 50 GHz in combination with a responsivity of 1 A/W or higher (for $\lambda\sim1.55$ μm) at an operating voltage which is acceptably low with regard to dark current and wiring, in particular an operating voltage of at most −2 V.

SUMMARY OF THE INVENTION

According to the invention, a diode comprising a light-sensitive germanium region is proposed, which is located on a waveguide made of silicon or silicon germanium and which has lateral dimensions in a direction transverse to a direction of light propagation in the waveguide that are identical or at most 20 nm per side shorter in comparison with the waveguide, wherein in the germanium region, the diode contains a lateral arrangement of an n-doped (i.e. n-type), an intrinsic and a p-doped (i.e. p-type) germanium region, the p-doped and the n-doped germanium regions each have doping elements extending from a surface of the germanium region to an upper edge of the waveguide and which can be contacted by p- and n-doped waveguide regions of the waveguide optionally located thereunder, and p- and n-doping fronts separated by the intrinsic region run parallel opposite each other, additional homogenously doped extensions of silicon or silicon germanium of the same conductive type, extending vertically to at least a level at the same height as the vertically highest point of the germanium region, laterally adjoin either only the p- and n-doped regions in the germanium region (5), or the p- and n-doped germanium regions, and additionally, where relevant, the p- and n-doped waveguide regions of the waveguide thereunder.

The proposed diode according to the invention is based on the realization that one cause of the disadvantage of the PIN photodiode known from [1] is that the two doped silicon regions underneath the intrinsic germanium region are arranged unfavorably with regard is to distribution of the electric field. It is based on the further realization that the field distribution is also non-optimal in the diode described in [2]. The approach taken to solving this problem is to obtain a field distribution that is largely without curvature. This is made possible by the diode according to the invention.

The structure of the diode according to the present invention allows a germanium PIN photodiode to be provided in embodiments and which simultaneously delivers a very large optical bandwidth and high optical responsivity at a low operating voltage. More particularly, it can avoid the disadvantages of the diodes described in [1] and [2] in respect of the bandwidth which is achievable, without abandoning their advantages regarding the responsivity that can be achieved.

In such an embodiment, the diode in the germanium region contains a lateral sequence comprising an n-doped, an intrinsic and a p-doped germanium region, the p-doped and the n-doped germanium regions each having a particularly preferred, but not necessarily identical or almost identical concentration of doping elements extending from a surface of the germanium region to a bottom edge of the waveguide. In this embodiment, parallel p- and n-doping fronts separated by the intrinsic region are opposite each other. A very advantageous field distribution is achieved as a result. This embodiment is based on the idea that, in order to simultaneously achieve a large bandwidth and high responsivity at a small operating voltage, a germanium PIN diode coupled to a silicon or silicon germanium waveguide should have an electric field that is distributed with as little curvature as possible within the intrinsic germanium region. To achieve this, the interfaces between the doped and the intrinsic semiconductor regions in the present embodiment are opposite and parallel to each other. It is also preferable that there is no protrusion of intrinsic regions relative to the doped regions at the interfaces.

With regard to field distribution, it is particularly advantageous that additional homogenously doped extensions of silicon or silicon germanium of the same conductivity type as the immediately adjacent germanium region, extending vertically to at least a level at the same height as the vertically highest point of the germanium region, laterally adjoin either only the p- and n-doped regions in the germanium region, or the p- and n-doped germanium regions, and additionally, where relevant, the p- and n-doped waveguide regions of the waveguide thereunder. The germanium region is thus covered laterally with silicon or silicon germanium, thus allowing the germanium region to be contacted via the differently doped extensions laterally adjoining the germanium region.

Embodiments of the inventive diode shall now be described.

In some embodiments, the waveguide projects a little beyond the lateral extension of the germanium region above it, namely on both sides, i.e., by a maximum of 20 nanometers to the left and the right of the germanium region in the cross-sectional view shown in the attached Figures.

The characteristics of the diode are further improved in an embodiment in which the dimension of the p- and n-doped germanium regions in the direction of the field are small in relation to the dimensions of the intrinsic germanium region. The dimensions of the p- and n-doped germanium regions in the direction of the field are preferably less than 50% of the dimensions of the intrinsic germanium region in each case. It is particularly preferred that the dimensions of the p- and n-doped germanium regions are less than 30% of the dimensions of the intrinsic germanium region. However, it is particularly preferred that the dimensions of the p- and n-doped germanium regions are at least 5% of the dimensions of the intrinsic germanium region and at least 10% in another embodiment.

The field distribution is further improved in a variant in which the p- and n-doping fronts continue beyond the germanium region in the direction of the substrate interior, that is to say vertically downward as far as the bottom edge of the waveguide, and separate the p- and n-doped waveguide regions from an intrinsic waveguide region.

In yet another embodiment, the extensions extend in the lateral direction from the germanium region to an (outer) diode edge defined by an insulator and lie on top of a silicon oxide layer. This embodiment advantageously allows direct contact between metal regions and the germanium region to be avoided. For example, in a one variant based on this, metal silicide layers cover at least horizontally extending parts of the extensions, that is to say parts extending in the lateral direction, without coming directly into contact with the germanium region. The low contact resistance which is thus achieved in relation to the doped silicon or silicon germanium regions is beneficial for the high-frequency behavior of the diode. In various alternative embodiments, the thickness of the silicon or silicon germanium section of the layer forming the extensions laterally from the germanium region is between 20 and 300 nm.

The diode preferably contains additional, vertically extending metal connectors which connect the metal silicide layers to metal structures which are arranged in a first horizontally structured metal plane and which allow an operating voltage to be applied to the diode.

The germanium region may be covered on the top with different layer stacks, which shall be described in greater detail below in connection with further embodiments.

In advantageous embodiments, the germanium region is covered by a silicon layer. The latter is preferably between 20 nm and 150 nm thick.

In other embodiments, the diode is covered with an insulating strip directly above the intrinsic germanium region or directly above an upwardly adjoining intrinsic silicon region of the silicon layer. The thickness of the insulating strip ranges between 50 nm and 500 nm in different variants of this embodiment.

In some of those embodiments, the lateral dimensions of the insulating strip are equal to or up to approximately 50% less than the total lateral (i.e., sideways) extension of the light-sensitive germanium region, a lateral protrusion of the germanium region relative to the insulating strip preferably being at least approximately equal on both sides. In some such embodiments, the germanium region is approximately 200 nm wide on either side than the insulating strip. When the vertical thickness of the layer strip is more than 300 nm, using such an insulating strip on the top side of the diode allows self-aligned implantation of doping elements for producing the p- and n-doped regions of the PIN structure. It is advantageous in this regard to choose implantation conditions that result in homogenous doping of the entire Si—Ge—(Si) stack in the vertical direction, which contributes further to achieving an electric field that is distributed with minimal curvature in the intrinsic germanium region.

Using the insulating strip even allows self-aligned silicide formation similar or even identical to that which is typically used for the transistors in CMOS or BiCMOS processes.

In other embodiments, however, the insulating strip may also be wider than the germanium region, for example up to 50% wide, and in one variant up to 200 nm wider on either side of the germanium region.

Spacers made of an insulating material, in particular of silicon nitride, preferably adjoin the insulating strip laterally and define a spacing between the insulating strip and the metal silicide layers.

By matching the width of the insulating strip and the germanium region, a diode structure can be formed which practically has only horizontal transitions between doped and intrinsic germanium regions over the entire vertical extension of the germanium region, thus largely avoiding any curvature of the electric field within the intrinsic germanium region. This can be additionally favored by matching the ratio of the lateral extension of doped to undoped germanium regions.

The diode according to the invention, or any one of the embodiments as described herein, is advantageously used as a photodiode.

A development of the diode takes the form of an optoelectronic component containing a diode according to the invention or one of its embodiments and an additional optical or optoelectronic component, preferably monolithically as an integrated component. Said component is in optical communication with the diode via the waveguide.

In various embodiments, the additional optical or optoelectronic component is at least a light emitter, at least a coupler for coupling light into or out of the waveguide, at least a light modulator or a combination of at least two of the aforesaid components.

A total height of the diode above the lower germanium/silicon interface is preferably 700 nm at most, or 500 nm at most in particularly preferred embodiments, said height including a maximum thickness of the germanium region above the lower interface and a thickness of any silicon layer that may (but not necessarily) be present above the germanium region. The total height of the diode is thus measured in the vertical direction from a lower interface between the germanium region and the waveguide thereunder to a top side of the silicon layer covering it, said top side facing away from the germanium region. A total detector height not exceeding 500-700 nm, measured from the lower interface, primarily meets the requirements of standard, multilevel metallization systems based on CMP (chemical mechanical polishing/planarization).

The actual height of the diode can be adjusted either by direct growth to the preferred layer thickness, or, to achieve lower dislocation densities, by initially applying a thicker germanium layer that is subsequently brought to the target thickness by etch back or CMP.

In one preferred embodiment as a PIN diode, the germanium region has a portion which is only intrinsically conductive, i.e., which is not intentionally doped, and which extends under an insulating strip which is disposed on the silicon layer covering the germanium layer from above, or which is disposed directly on the surface of the germanium layer, the lateral extension of said strip substantially determining the lateral extension of the intrinsic region of the diode during production of the diode.

In developments of the embodiment as a PIN diode, doped germanium and silicon regions laterally adjoin the intrinsically conductive portion of the germanium region and extend laterally from the intrinsic germanium region of the diode to a diode edge which is typically defined by an insulator. Steep doping profiles are conducive to the photodiode having a large optical bandwidth.

BRIEF DESCRIPTION OF THE DRAWINGS

The features and advantages of the PIN photodiode according to the invention shall now be described in more detail with reference to the attached Figures, in which.

DETAILED DESCRIPTION

Two embodiments of a PIN photodiode according to the invention shall firstly be described below with reference to FIGS. 1 and 21. Like all the other Figures except for FIG. 2a, these Figures show cross-sections through the structure and perpendicular to the direction of incident light.

FIGS. 2 to 20 then illustrate, with schematic views of different stages in the process, two examples of processes for producing these embodiments of the PIN photodiode according to the invention, and they also illustrate the features of such a PIN photodiode.

Figure 1:
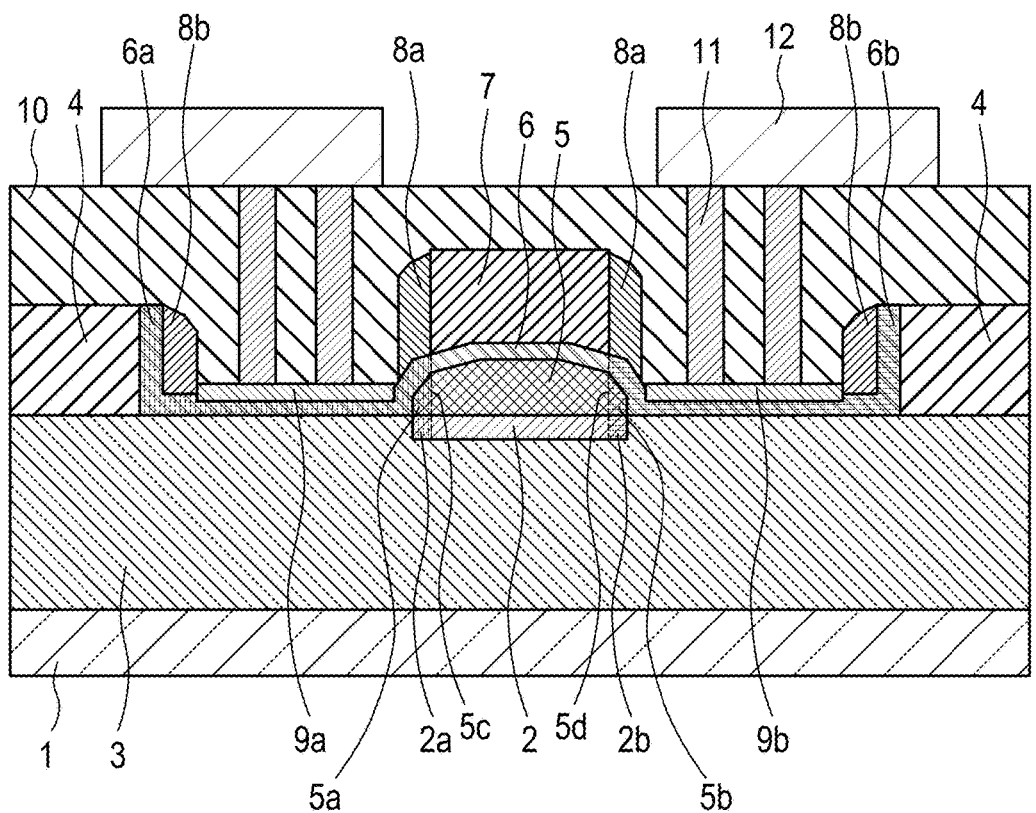
FIG. 1 shows a first embodiment of a PIN photodiode according to the invention, in a cross-sectional view.

FIG. 1 illustrates a first embodiment of a PIN photodiode according to the invention. On a monocrystalline silicon waveguide consisting of p- and n-doped regions 2a and 2b and intrinsic region 2 and framed laterally and from below by a silicon dioxide layer 3 vertically adjoining a silicon substrate 1, there is a germanium layer containing doped regions 5a and 5b and intrinsic region 5. This germanium layer is covered with a silicon layer consisting of doped regions 6a and 6b and an undoped region 6. As essential aspect for the PIN photodiode according to the invention is that the silicon waveguide below the germanium layer does not project laterally beyond the latter. The entire diode structure is laterally enclosed by an insulator layer 4, preferably by a silicon oxide layer. The diode structure is also covered with an insulating strip 7, which, as explained in more detail below, allows self-aligned production of intrinsic regions 2, 5 and 6 with p- and n-doped regions 2a, 2b, 5a, 5b, 6a and 6b. Lateral insulating spacers 8a and 8b, which are formed simultaneously, are optional. Spacers 8a enhance reliability in the prevention of undesired diode leakage currents which would occur if metal silicide layers 9a and 9b formed on doped regions 6a and 6b were to come inadvertently into contact with intrinsic silicon region 6.

Figure 21:
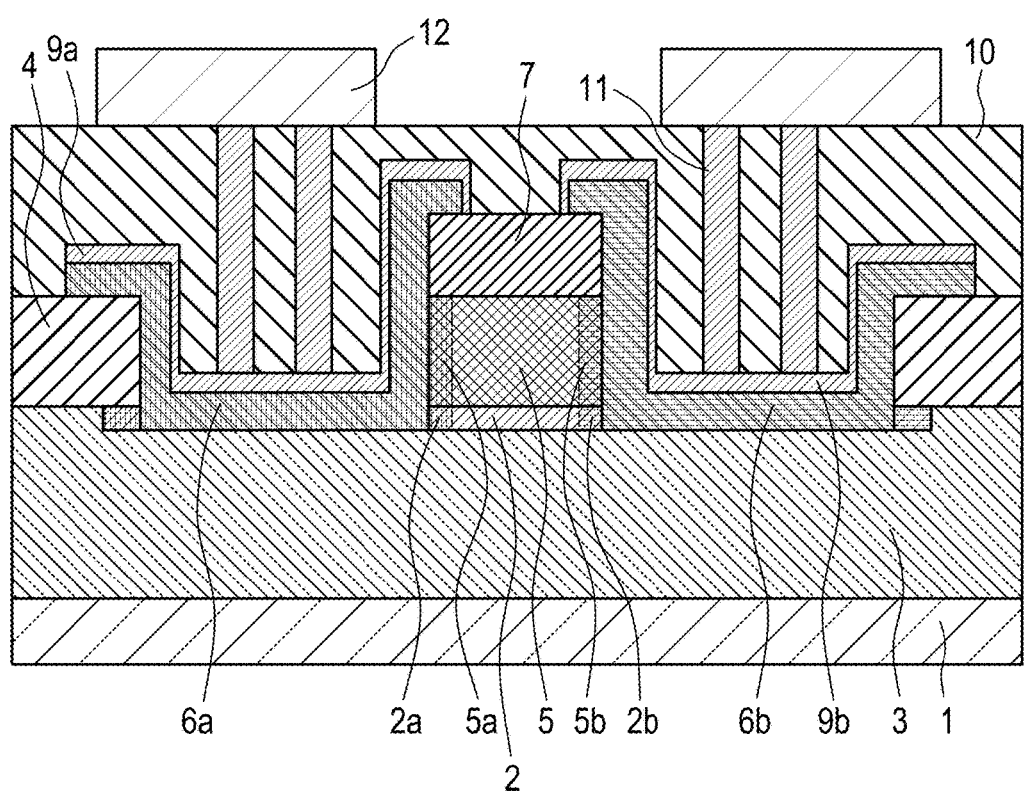

FIG. 21 illustrates a second embodiment of a PIN photodiode according to the invention. It differs from the embodiment illustrated in FIG. 1 above all in two details, namely the absence of undoped silicon region 6 and the absence of the lateral insulating spacers 8a. In this embodiment, these spacers may be left out in any case, because the leakage current mechanism referred to in connection with the first embodiment is completely avoided due to the simultaneous absence of undoped silicon region 6. A potential advantage of this embodiment in comparison with the first embodiment is a reduced series resistance as a result of increasing the extent of metal silicide coverage over doped silicon regions, which is beneficial for bandwidth.

Production processes for the first and second embodiments of the PIN photodiode according to the invention shall now be described with reference to FIGS. 2-11 and 12-20.

Figure 2:
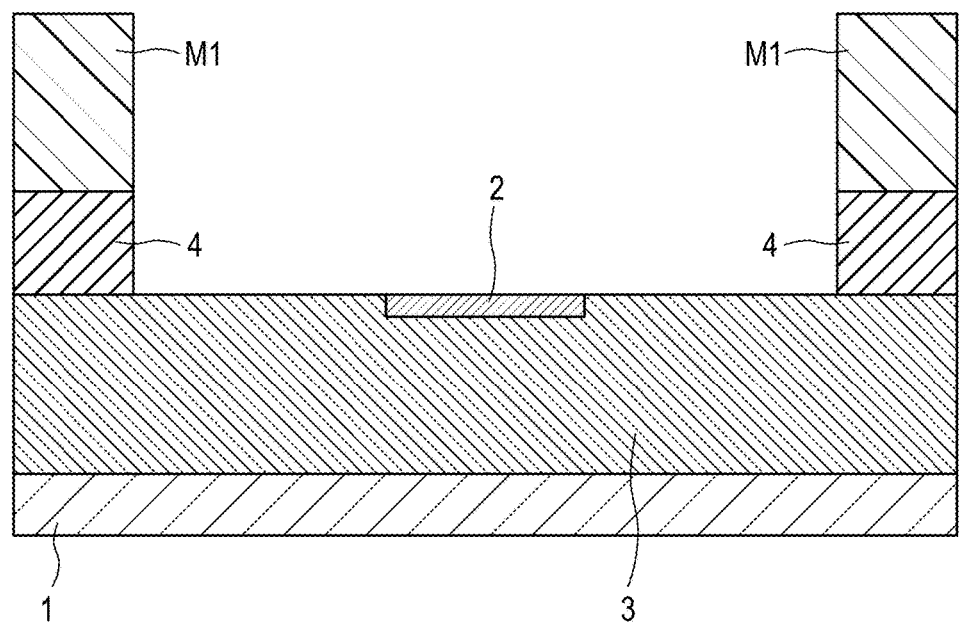
FIG. 2 shows, in a cross-sectional view, a first stage in a variant of a process for producing the PIN photodiode of FIG. 1.
Figure 2A:
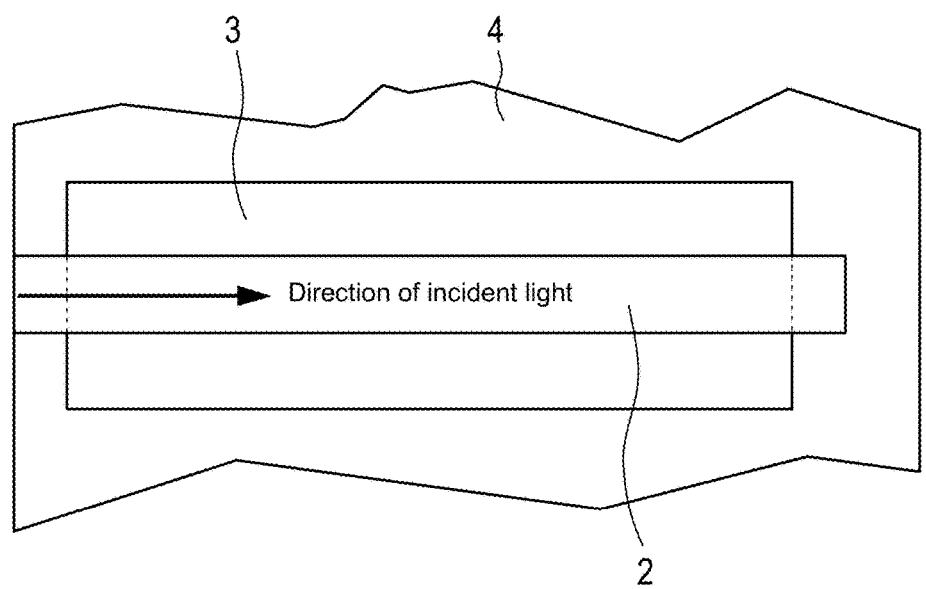
FIG. 2a shows a plan view of the process stage shown in FIG. 2.

FIG. 2 shows the state of the region, in which the germanium PIN diode is subsequently produced, after production of a silicon waveguide 2 and subsequent etching of a window in an insulating layer 4 by means of a resist mask M1. Waveguide 2 and silicon dioxide layer 3, which are on a silicon substrate 1, form a largely planar surface inside the etched window after etching layer 4. It is essential that the etched window projects beyond waveguide 2 on both sides. It should be noted that the position of the window edges relative to the waveguide in the direction of incident light is different, as illustrated in a plan view in FIG. 2a.

Figure 3:
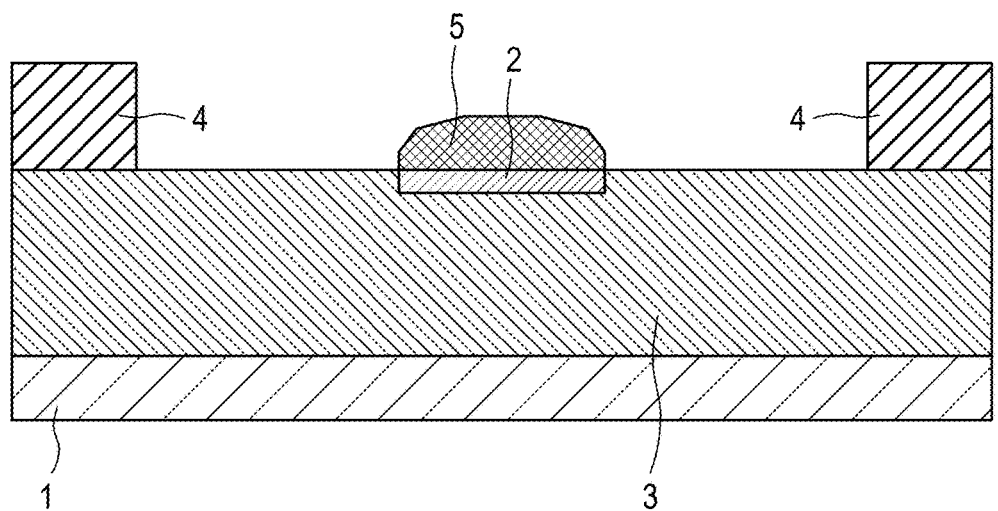
FIGS. 3-11 show, in respective cross-sectional views, subsequent stages in the variant of a process for producing the PIN photodiode of FIG. 1.
Figure 4:
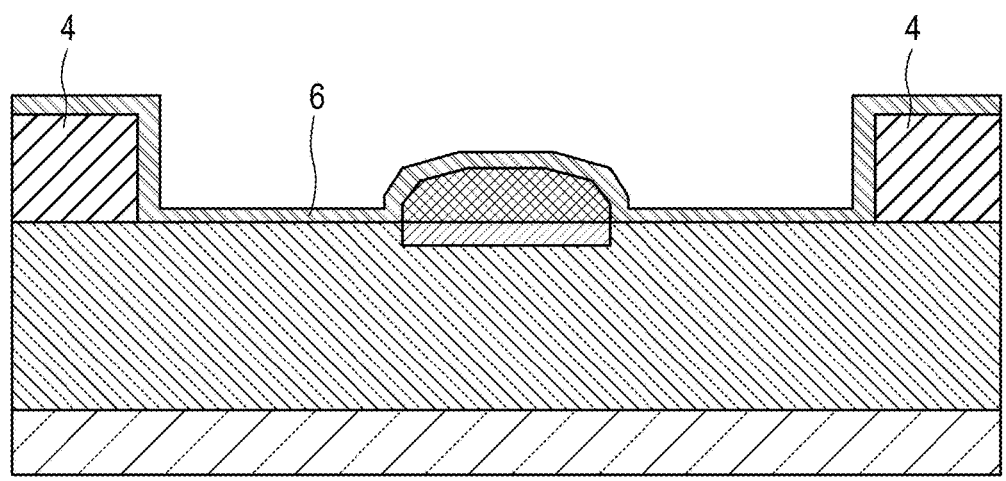

FIG. 3 shows the stage in the diode production process after selective, epitaxial growth of an undoped germanium layer 5 on the silicon waveguide. Facet formation on the upper side of germanium layer 5, typical for selective Ge growth on (100) oriented silicon, is indicated schematically. As illustrated in FIG. 4, a silicon layer 6 is selectively deposited immediately after selective growth of the germanium layer.

Figure 5:
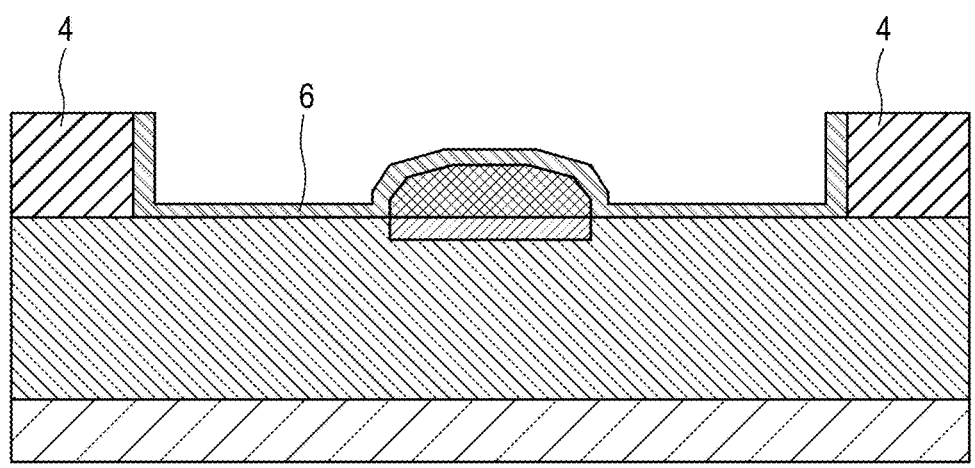

FIG. 5 shows a further stage in the diode production process. By means of chemical mechanical polishing (CMP), those parts of the silicon layer 6 that were located outside of the window etched into layer 4 are removed. Providing a sufficient vertical protrusion of insulator layer 4 above the part of the silicon layer 6 which covers the germanium layer inside the window ensures the integrity of the latter during the CMP process. The extensions of silicon layer 6 that are still present to the sides of the germanium region in the etched window, and which can be used for contacting the diode with low loss, are important for achieving the diode characteristics being striven for, and for high responsivity, in particular.

Figure 6:
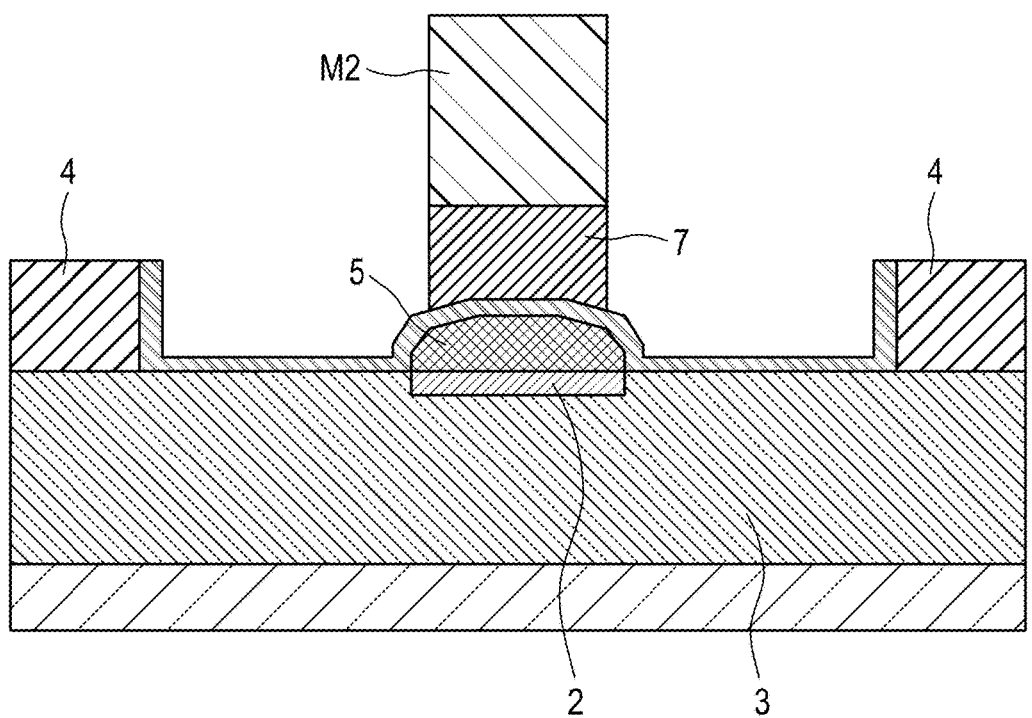

FIG. 6 illustrates a next stage in the production process for the first embodiment of the PIN photodiode according to the invention. An insulator layer has been etched using a resist mask M2. With the alignment precision that is normal in present-day lithography technology, Mask M2 has been positioned as centered as possible in relation to waveguide 2 and the germanium region above it. The mask width and, correlated therewith, the width of the insulating strip 7 that remains after etching, is selected such that it is less than the width of waveguide 2. The height of strip 7 above silicon region 6 is selected such that doping elements are prevented in subsequent implantation steps from traveling in a perpendicular direction through stripe 7 into regions of layers 6 and 5 located underneath strip 7. In this way, it is possible for doped and undoped (intrinsic) silicon and germanium regions to be produced in a reciprocally self-aligned manner.

Figure 7:
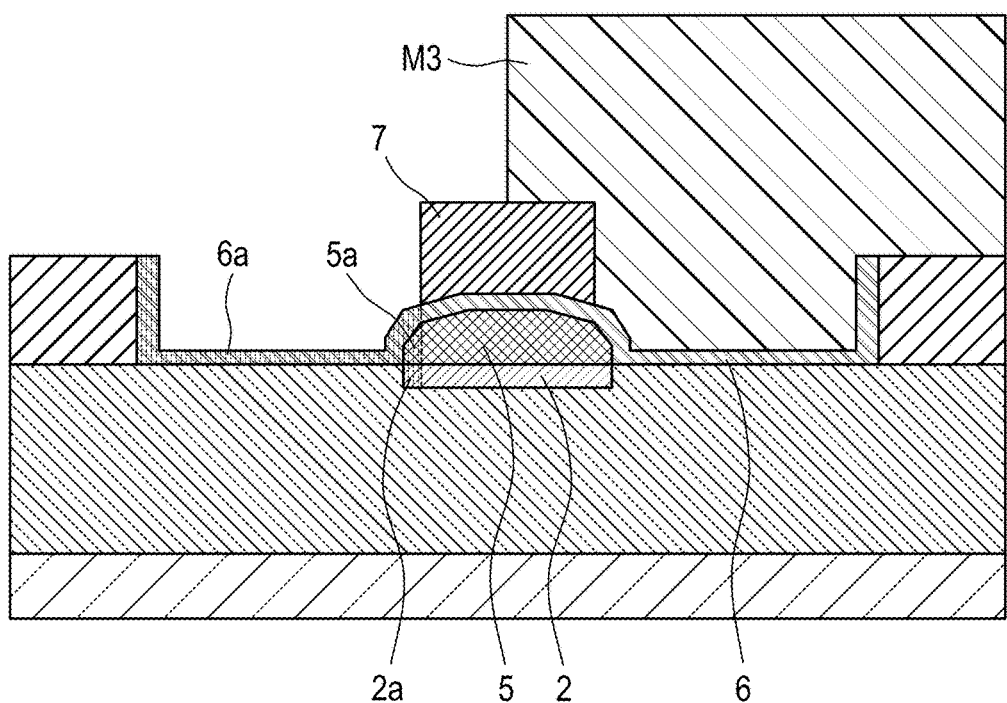
Figure 8:
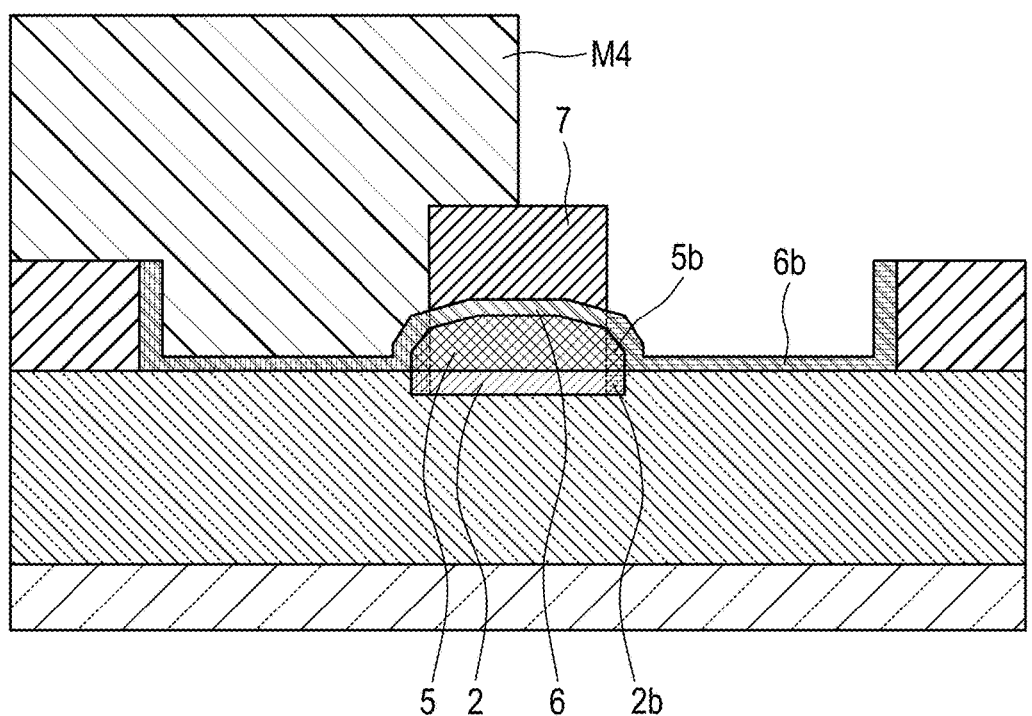

FIGS. 7 and 8 illustrate how the p- and n-doped regions of the PIN diode structure are produced by utilizing the previously formed insulating strip 7 for self-alignment of doped regions to intrinsic silicon and germanium regions. Doping elements commonly used in semiconductor technology, such as boron for p-doping and phosphorus or arsenic for n-doping, are used for the respective implantation steps. Implantation conditions, such as energies and dosages, are selected such that doping is virtually homogenous in the perpendicular direction within the entire implanted Si/Ge/Si stack (2a, 5a and 6a, and 2b, 5b and 6b); this is important if the electric field distribution in the remaining intrinsic germanium region 5 is to be largely without curvature.

Figure 9:
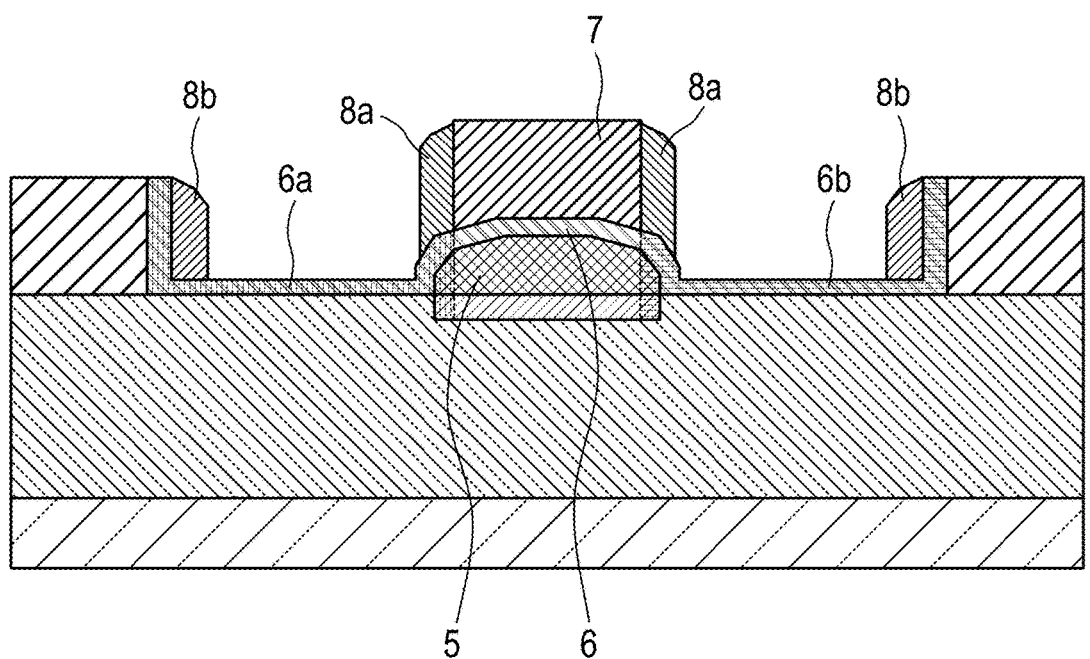

The next stage in production of the first embodiment of the PIN photodiode according to the invention is illustrated in FIG. 9. Spacers 8a and 8b are formed by conformal deposition of an insulator layer, preferably silicon nitride, and subsequent anisotropic etching of said layer. Spacers 8a enhance reliability in the prevention of the undesired diode leakage currents which would occur if the metal silicide layer formed on doped regions 6a and 6b were to come into contact with intrinsic silicon region 6. These spacers are optional, in that they are not necessarily required. Whether they must be formed or not depends, for example, on the specific thermal steps which generally follow doping by implantation in the production process and which, if they result in a certain lateral sub-diffusion of the doping elements beneath layer 7, obviate the need to form spacers.

Figure 10:
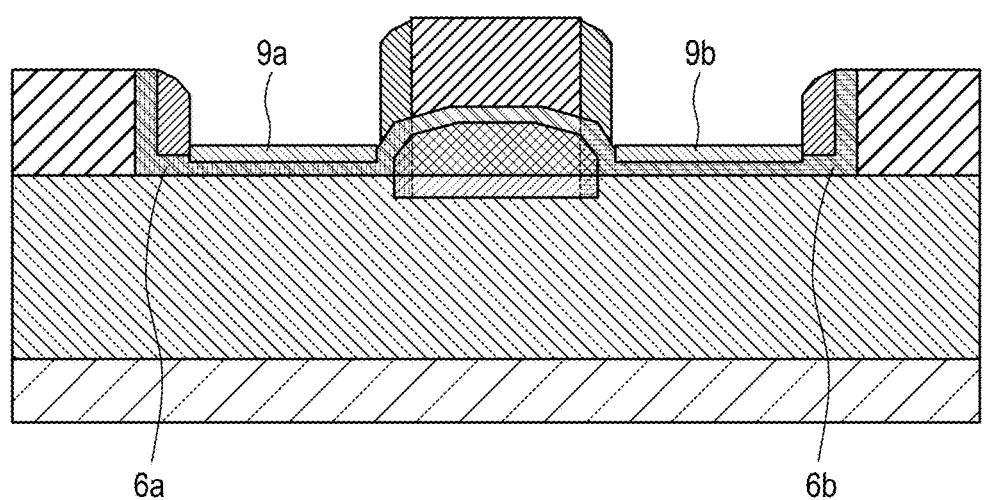

The formation of metal silicide layers 9a and 9b on doped silicon layers 6a and 6b by means of the production steps commonly used in semiconductor technology is illustrated in FIG. 10. Layers 9a and 9b serve to keep the series resistance of the diode low, which has beneficial effects with regard to the bandwidth that can be achieved.

Figure 11:
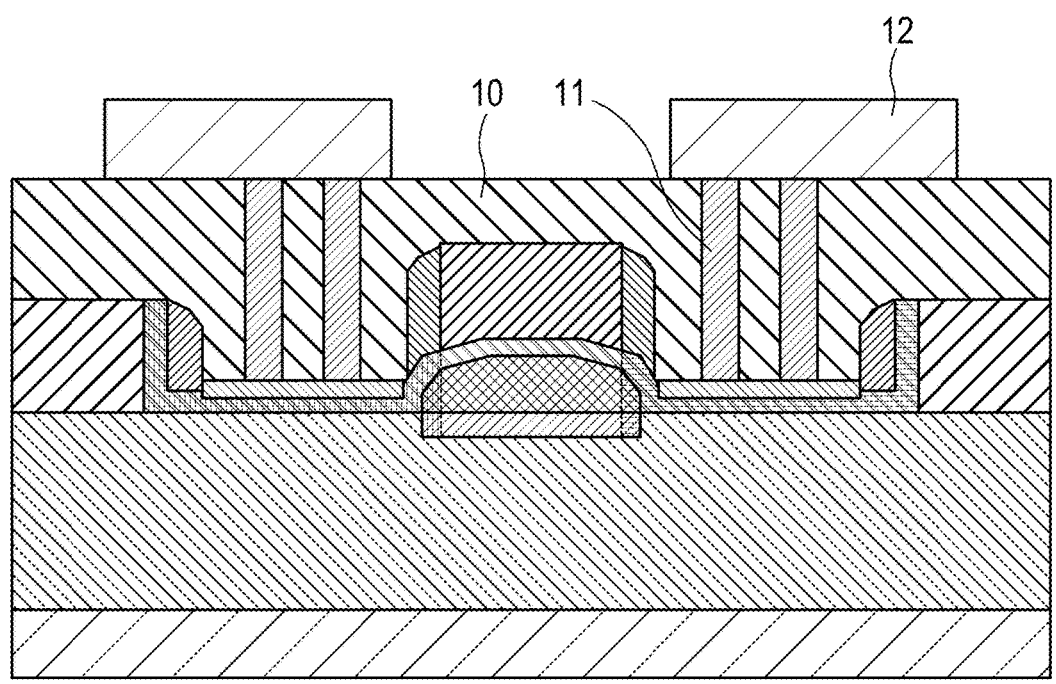

The final stage in production of the first embodiment of the PIN photodiode according to the invention is illustrated in FIG. 11. Perpendicular metal connectors 11, preferably but not necessarily consisting mainly of tungsten, were embedded in an insulator layer 10 by means of production steps that are commonly used in semiconductor technology. They were then connected to a first structured metal layer 12, preferably but not necessarily consisting mainly of aluminum. The structured metal layer 12 can be used immediately for operating the diode. It can also be connected equally well to metal layers that are located higher up but not shown here, but that is of no relevance for the invention.

A process for producing the second embodiment of the germanium PIN photodiode according to the invention shall now be described.

Figure 12:
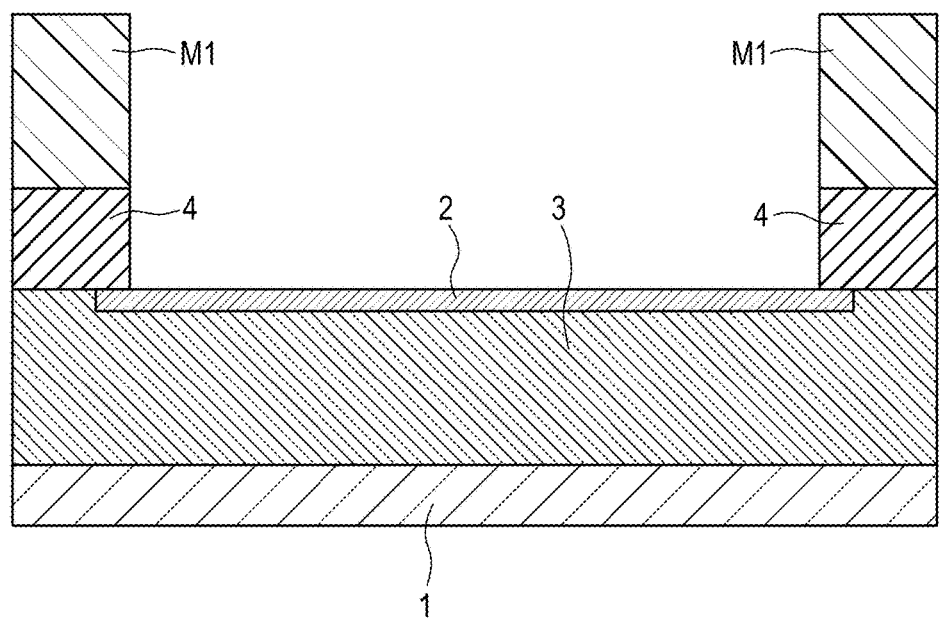
FIGS. 12-21 show, in respective cross-sectional views, an embodiment of a production process for a PIN photodiode as shown in FIG. 21.

FIG. 12 shows the state of the region, in which the germanium PIN diode is subsequently produced, after production of a silicon waveguide 2 and subsequent etching of a window in an insulating layer 4 by means of a resist mask M1. Unlike the process for producing the first embodiment (see FIG. 2), waveguide 2 extends here laterally on both sides beyond the window etched in layer 4.

Figure 13:
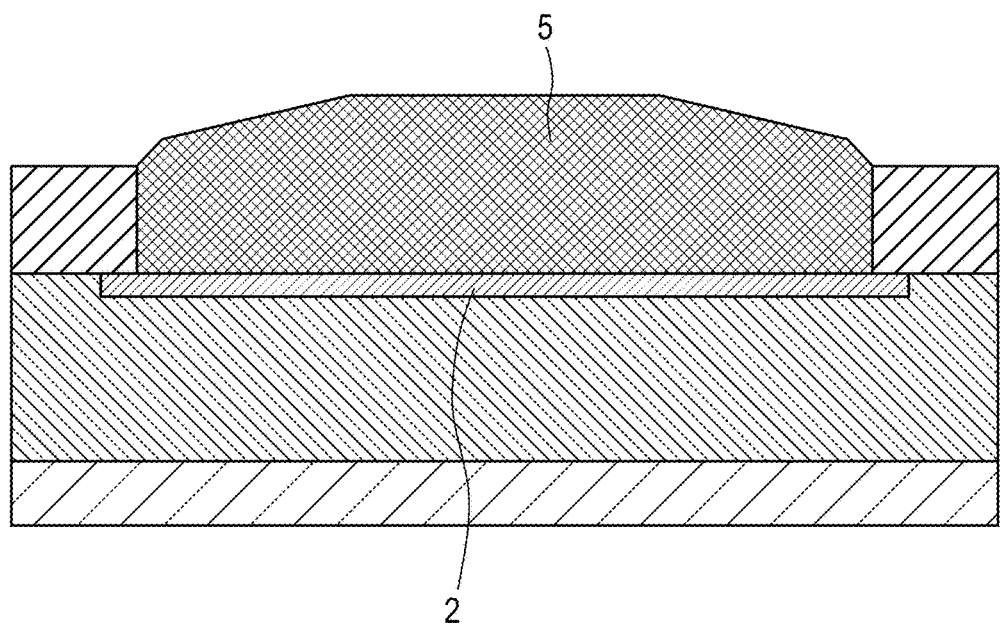

FIG. 13 shows the stage in the diode production process after subsequent selective, epitaxial growth of an undoped germanium layer 5 on silicon waveguide 2. In contrast to the production process for the first embodiment (see FIG. 3), a germanium layer thickness is chosen that is significantly greater than the thickness of insulator layer 4. The aim is to avoid facet formation underneath the top edge of layer 4.

Figure 14:
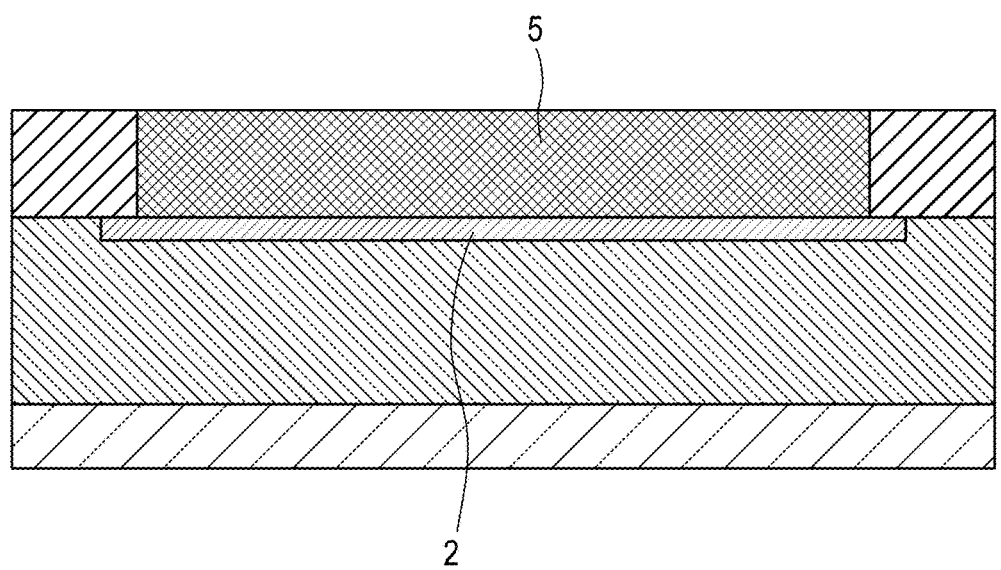

FIG. 14 shows the diode structure after a Ge-CMP step which follows germanium epitaxy and which results in an almost planar surface of layers 4 and 5.

Figure 15:
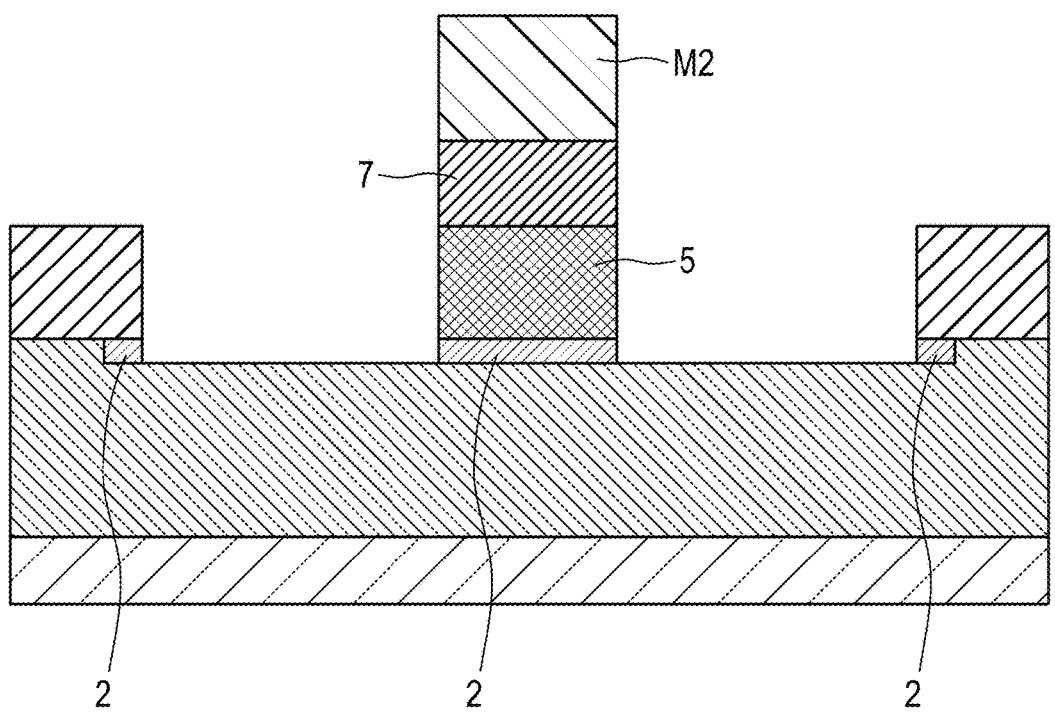

FIG. 15 illustrates a next stage in the production process for the second embodiment of the PIN photodiode according to the invention. In contrast to the production process for the first embodiment (see FIG. 6), resist mask M2 is used here for etching not only insulator layer 7, but also germanium layer 5 and silicon layer 2 thereunder. With the alignment precision that is normal in present-day lithography technology, Mask M2 has been positioned as centered as possible in relation to waveguide 2 and the germanium region above it, although significantly greater alignment tolerances are allowed here in comparison to the to the production process for the first embodiment. As in the production process for the first embodiment, the thickness of strip 7 is selected such that doping elements are prevented in subsequent implantation steps from traveling in a perpendicular direction through stripe 7 into regions of layers 6 and 5 located underneath strip 7. In this way, it is possible for doped and undoped (intrinsic) silicon and germanium regions to be produced in a reciprocally self-aligned manner.

Figure 16:
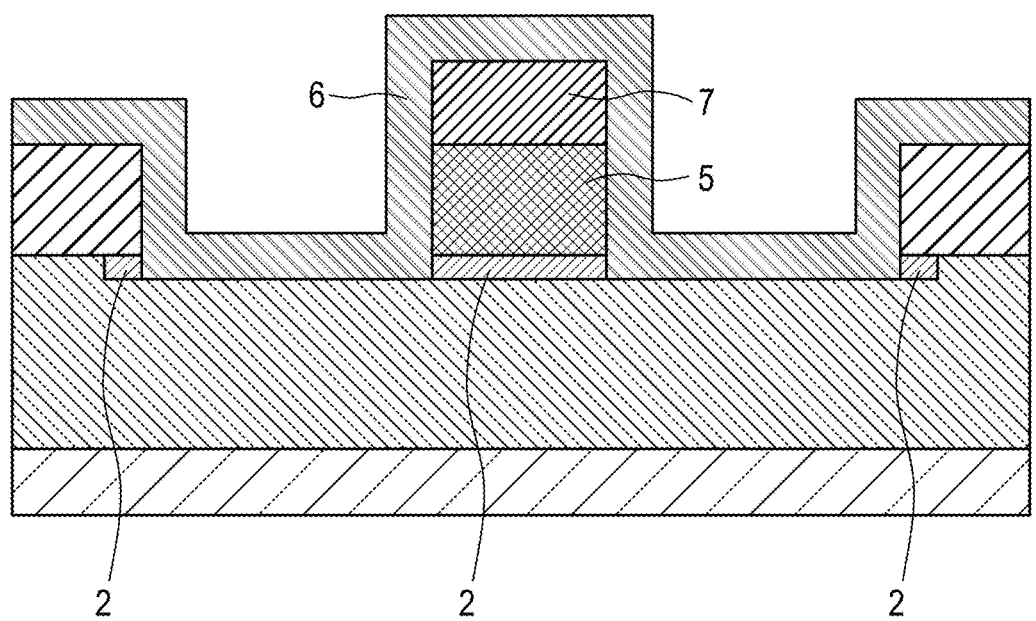
Figure 17:
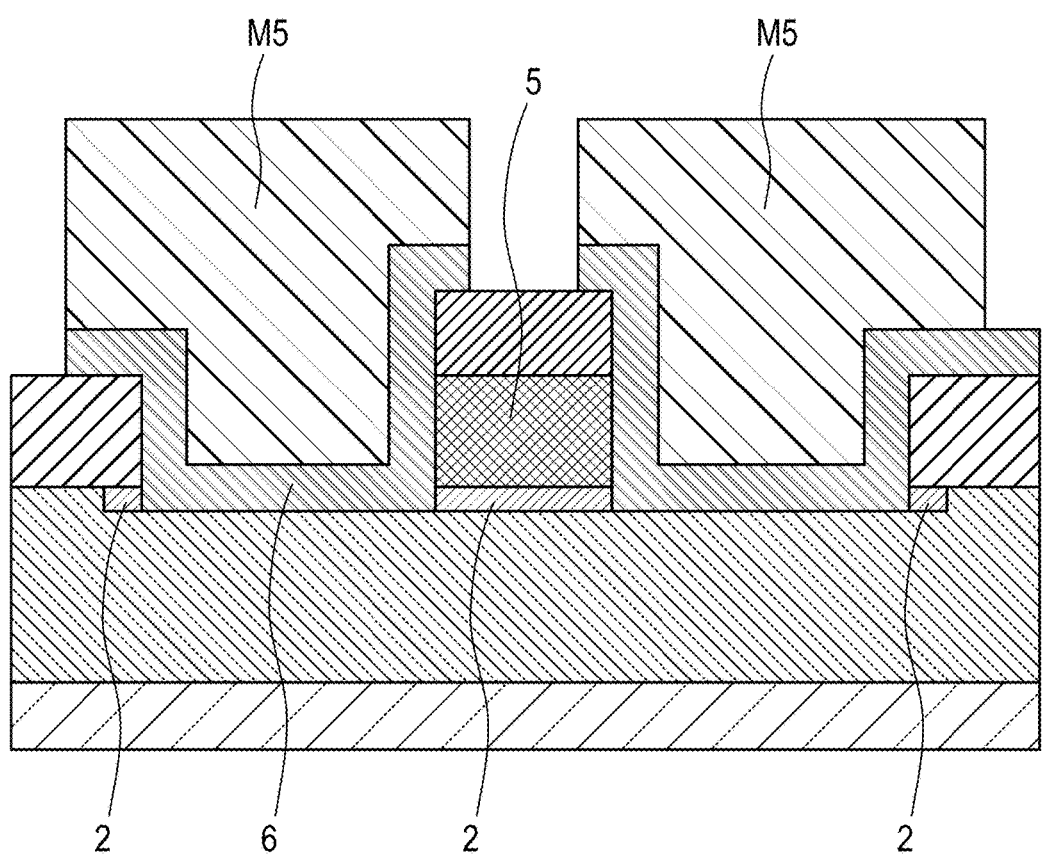

The next step involves depositing a silicon layer 6 and structuring it by means of resist mask M5, as illustrated in FIGS. 16 and 17. It should be noted in this case that, in contrast to the production process for the first embodiment (see FIG. 4, for example), layer 6 touches only the side walls of germanium layer 5.

Figure 18:
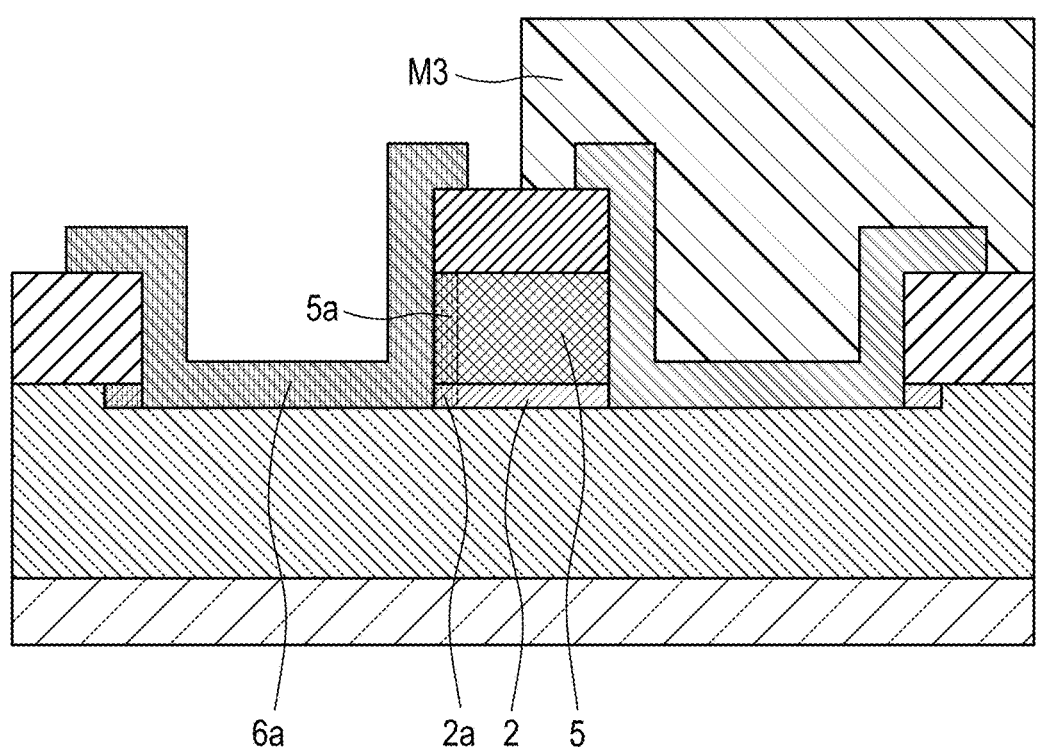
Figure 19:
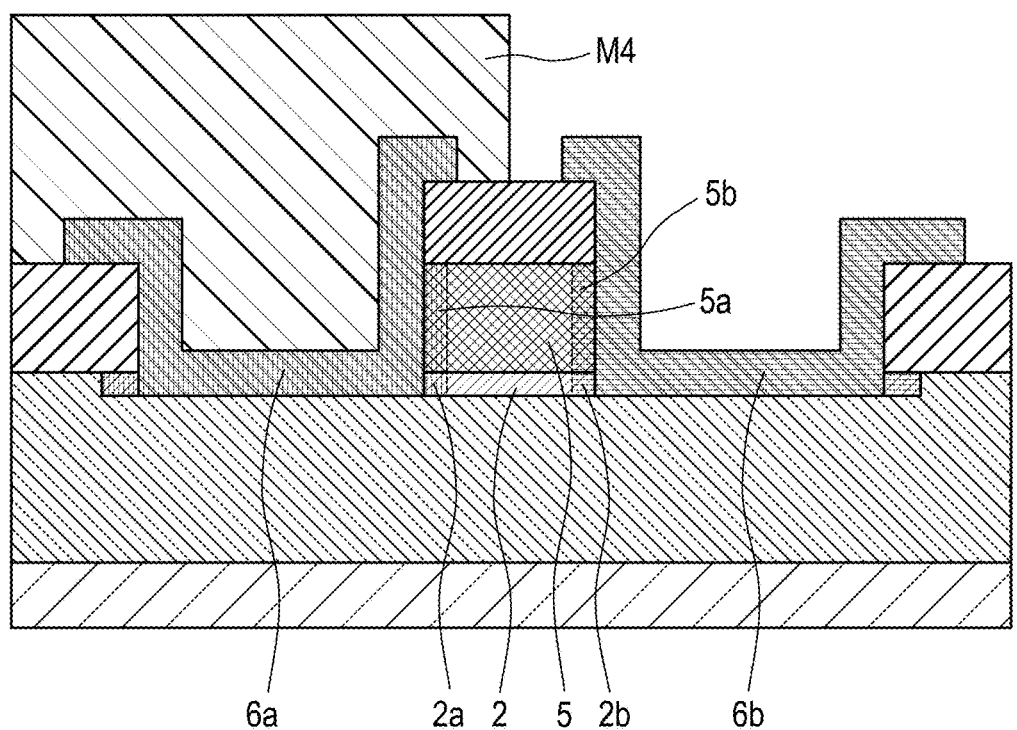

FIGS. 18 and 19 illustrate how p- and n-doped regions 2a, 2b, 5a, 5b, 6a and 6b of the PIN diode structure are produced by utilizing the previously formed insulating strip 7 for self-alignment of doped regions to intrinsic silicon and germanium regions. In order to produce doped regions 2a, 2b, 5a and 5b, doping elements are implanted from an angle which differs from the perpendicular, and/or by utilizing lateral diffusion from layers 6a and 6b brought about by thermal treatment. As in the production process for the first embodiment, it is important here again that the process conditions for implantation and subsequent thermal steps are selected which result in practically homogenous doping in the perpendicular direction in regions 2a and 5a, and 2b and 5b, respectively, which is essential for achieving the largely uncurved distribution of electrical field in the remaining intrinsic germanium region 5, as striven for.

Figure 20:
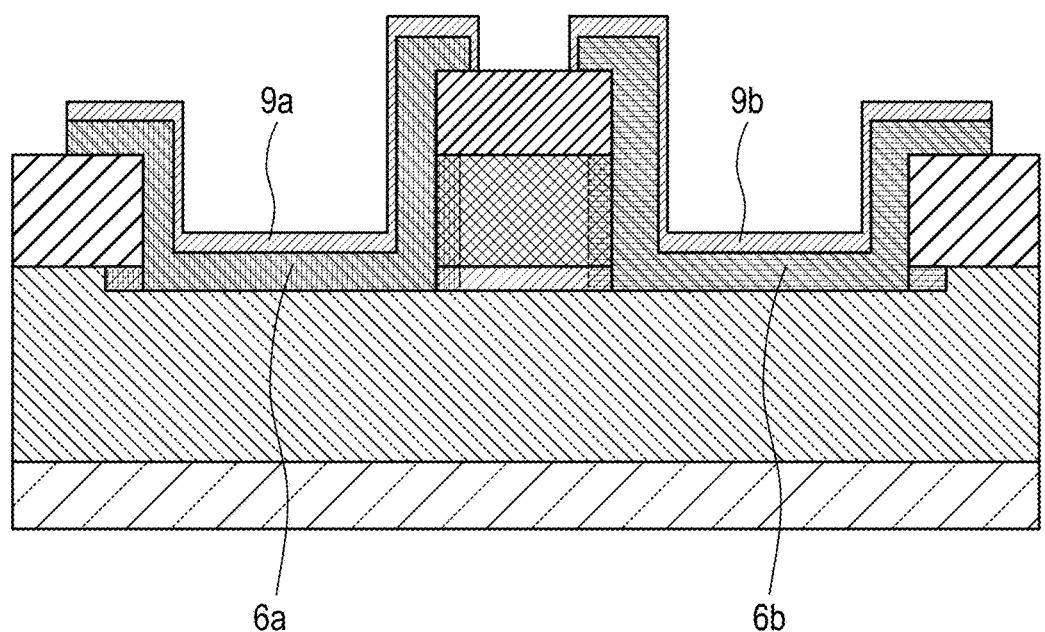

FIGS. 20 and 21 illustrate completion of the second embodiment of the germanium PIN photodiode according to the invention. In contrast to the production process for the first embodiment, formation of spacers 8a (see FIG. 9) may be dispensed with here, because the leakage current mechanism referred to in connection with the first embodiment is completely avoided due to the simultaneous absence of undoped silicon region 6. Due to the spacers being dispensed with, it is possible for metal silicide to be formed on more or less perpendicular parts of doped silicon layers 6a and 6b, which increases the extent of metal silicide coverage over doped silicon regions, thus allowing the series resistance of the diode to be reduced.

Figure 22:
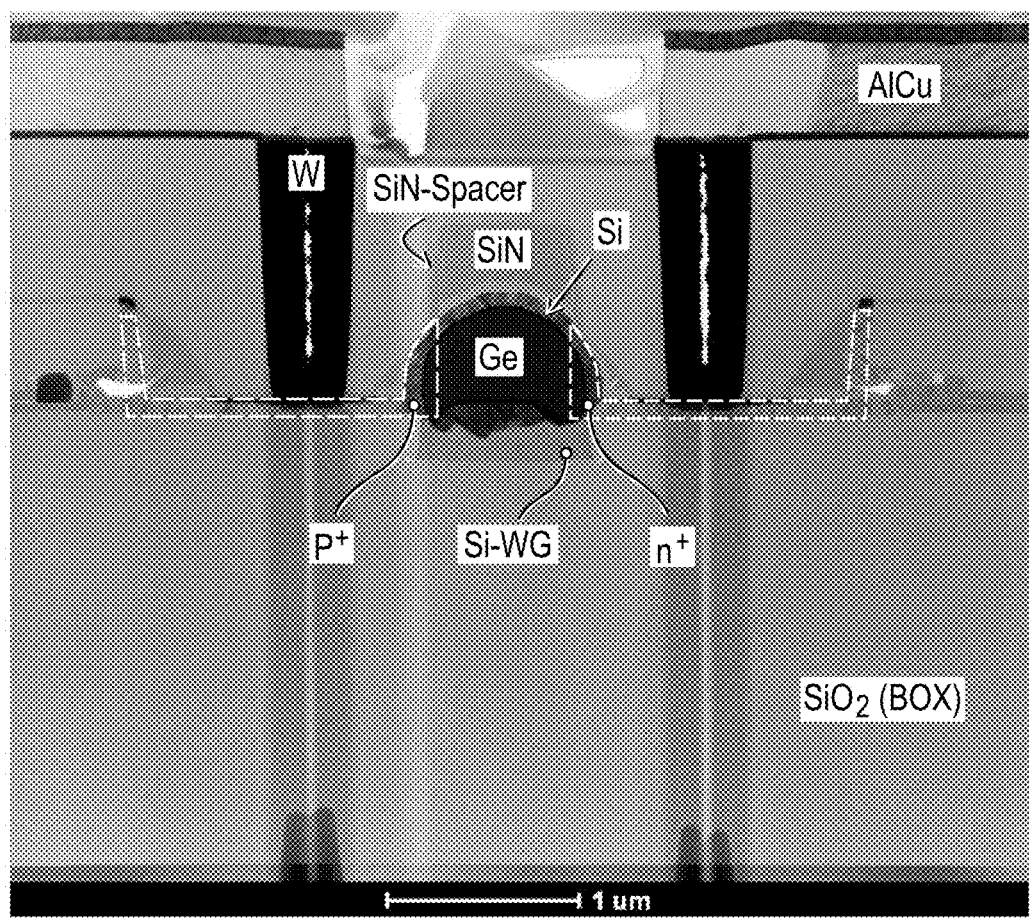
FIG. 22 shows an electron microscopic cross-sectional view of a PIN diode corresponding in structure to the embodiment shown schematically in FIG. 1.

FIG. 22 shows an electron microscopic cross-sectional view of a PIN diode corresponding in structure to the embodiment shown schematically in FIG. 1. Broken lines are drawn in order to illustrate the position of the doped silicon extensions. The structure marked Si-WG forms the waveguide, and the structure marked W is a connector element made of tungsten.

Figure 23:
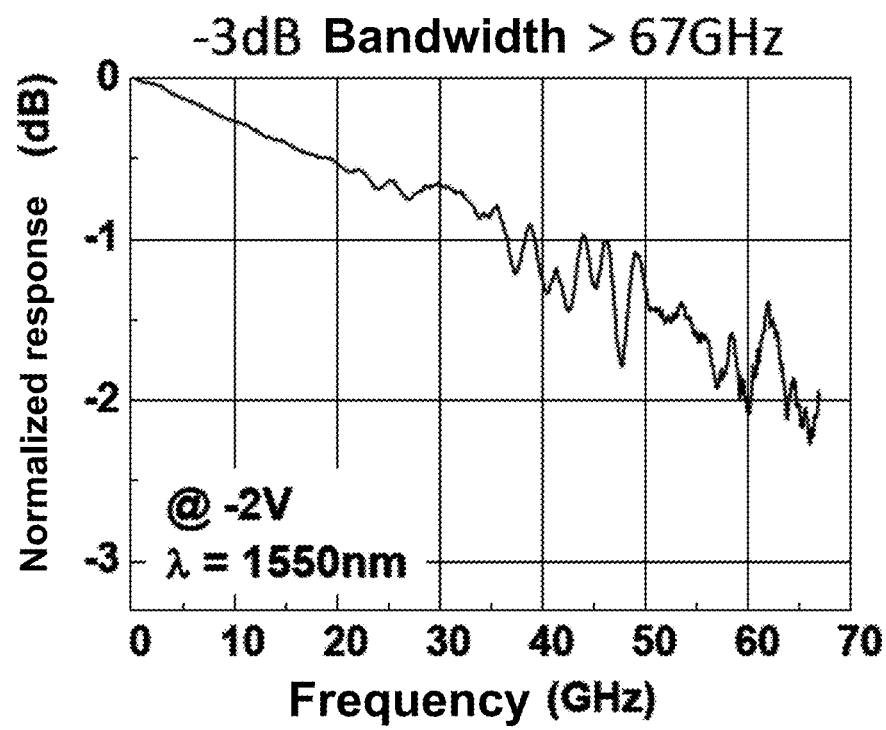
FIGS. 23-25 show measurement data obtained from a diode structure according to FIG. 22.
Figure 24:
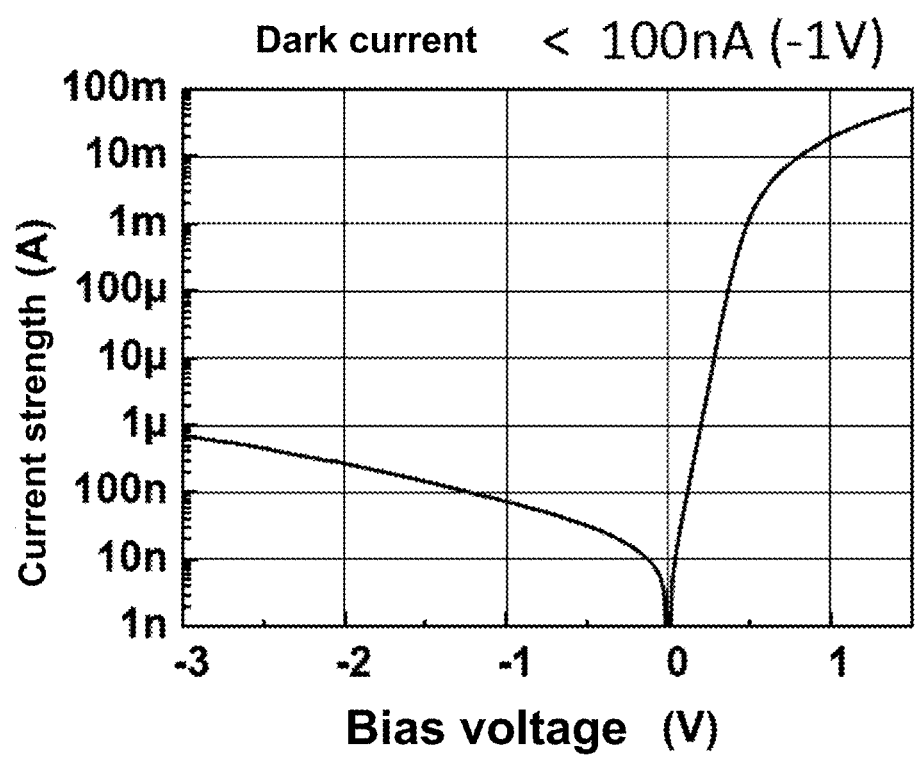
Figure 25:
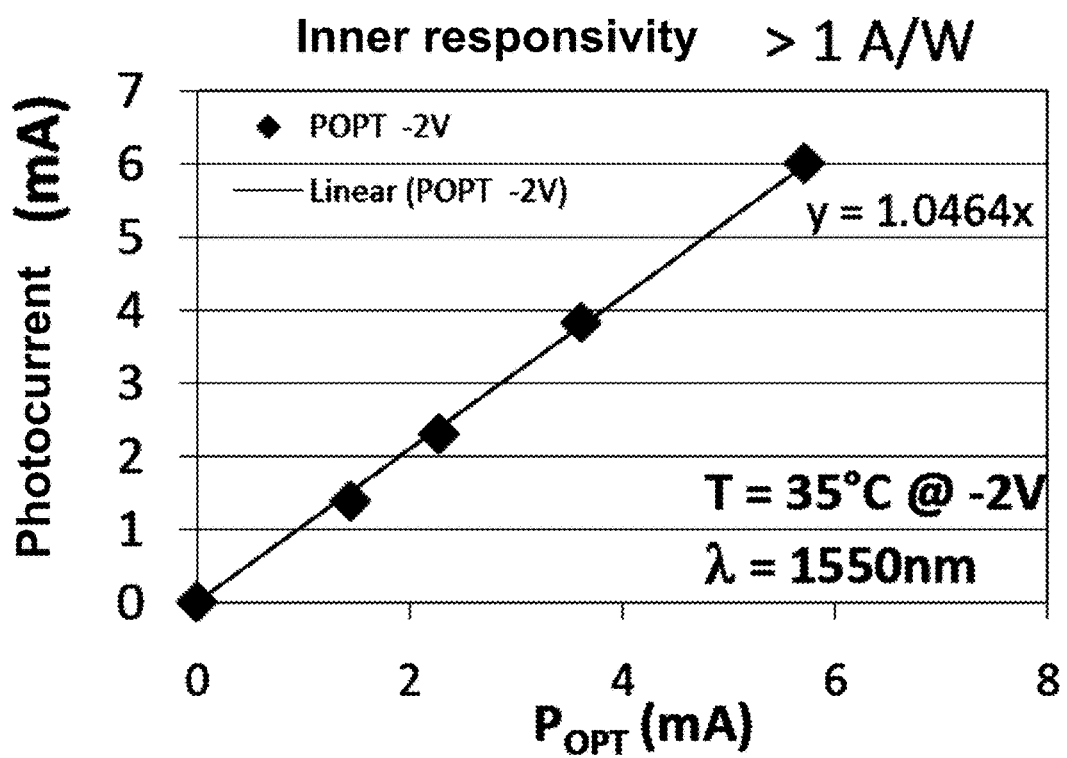

FIGS. 23-25 show measurement data recorded on a diode structure according to FIG. 22, and indicating the high bandwidth (FIG. 23), the low dark current under operating conditions with a maximum operating voltage of −2 V (FIG. 24) and the high responsivity of >1 A/W that is achieved at a wavelength of 1550 nm and an operating voltage of −2 V (FIG. 25).

In summary, a diode is thus described which has a light-sensitive germanium region located on a waveguide made of silicon or silicon germanium and which has lateral dimensions in a direction transverse to a direction of light propagation in the waveguide that are identical or at most 20 nm per side shorter in comparison with the waveguide. The diode is preferably, but not necessarily a P-I-N-diode, where P stands for p-conductive, I for intrinsically conductive and N for n-conductive. Thus, in the context of this application, the capital letters N and P are used only to show the type of doping conductivity type, not a particular element.

What is claimed is:

1. A diode comprising a light-sensitive germanium region, which is located on a waveguide made of silicon or silicon germanium and which has lateral dimensions in a direction transverse to a direction of light propagation in the waveguide that are identical or at most 20 nm per side shorter in comparison with the waveguide, wherein in the germanium region, the diode contains a lateral arrangement of an n-doped, an intrinsic and a p-doped germanium region, the p-doped and the n-doped germanium regions each have doping elements extending from a surface of the germanium region to an upper edge of the waveguide and which optionally can be contacted by p- and n-doped waveguide regions of the waveguide located thereunder, and p- and n-doping fronts, separated by the intrinsic region, run parallel opposite each other, additional homogenously doped extensions of silicon or silicon germanium of the same conductive type, extending vertically to at least a level at the same height as the vertically highest point of the germanium region, laterally adjoin either only the p- and n-doped regions in the germanium region, or the p- and n-doped germanium regions, and additionally, if present, the p- and n-doped waveguide regions of the waveguide thereunder.

2. The diode according to claim 1, wherein the extensions extend in the lateral direction from the germanium region to a diode edge defined by an insulator and lie on top of a silicon oxide layer.

3. The diode according to claim 2, wherein the metal silicide layers cover at least horizontally extending parts of the extensions, that is to say parts extending in the lateral direction.

4. The diode according to claim 3, containing the vertically extending metal connectors which connect the metal silicide layers to metal structures which are arranged in a first horizontally structured metal plane and which allow an operating voltage to be applied to the diode.

5. The diode according to claim 4, wherein the germanium region is covered by a silicon layer having a layer thickness ranging between 20 nm and 150 nm.

6. The diode according to claim 5, covered directly above the intrinsic germanium region or an upwardly adjoining intrinsic silicon region of the silicon layer with an insulating strip, the thickness of which is between 50 nm and 500 nm and the lateral dimensions of which are equal to or up to approximately 50% less than the total lateral extension of the light-sensitive germanium region, wherein a lateral protrusion of the germanium region relative to the insulating strip is approximately equal on both sides.

7. The diode according to claim 6, wherein spacers made of an insulating material, in particular of silicon nitride, laterally adjoin the insulating strip.

8. The diode according to claim 5, wherein a total height of the diode, measured in the vertical direction from a lower interface between the germanium region and the waveguide thereunder to a top side of the silicon layer covering it, said top side facing away from the germanium region, is at most 700 nm.

9. The diode according to claim 8, wherein the total height is 500 nm at most.

10. An optoelectronic component comprising a diode according to claim 1 and an additional optical or optoelectronic component which is in optical communication with the diode via the waveguide.

11. The optoelectronic component according to claim 10, wherein the additional optical or optoelectronic component is at least a light emitter, at least a coupler for coupling light into or out of the waveguide, at least a light modulator or a combination of at least two of the aforesaid components.

12. The diode according to claim 1, wherein the germanium region is covered by a silicon layer having a layer thickness ranging between 20 nm and 150 nm.

13. The diode according to claim 12, covered directly above the intrinsic germanium region or an upwardly adjoining intrinsic silicon region of the silicon layer with an insulating strip, the thickness of which is between 50 nm and 500 nm and the lateral dimensions of which are equal to or up to approximately 50% less than the total lateral extension of the light-sensitive germanium region, wherein a lateral protrusion of the germanium region relative to the insulating strip is approximately equal on both sides.

14. The diode according to claim 13, wherein spacers made of an insulating material, in particular of silicon nitride, laterally adjoin the insulating strip.

15. The diode according to claim 12, wherein a total height of the diode, measured in the vertical direction from a lower interface between the germanium region and the waveguide thereunder to a top side of the silicon layer covering it, said top side facing away from the germanium region, is at most 700 nm.

* * * * *